(12) United States Patent
Bettineschi et al.

(10) Patent No.: US 9,165,828 B2
(45) Date of Patent: Oct. 20, 2015

(54) SEMICONDUCTOR DEVICE COMPRISING A FUSE STRUCTURE AND A METHOD FOR MANUFACTURING SUCH SEMICONDUCTOR DEVICE

(71) Applicant: Infineon Technologies AG, Neubiberg (DE)

(72) Inventors: Gabriele Bettineschi, Munich (DE); Uwe Seidel, Munich (DE); Wolfgang Walter, Kaufbeuren (DE); Michael Schrenk, Diessen (DE); Hubert Werthmann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/153,322

(22) Filed: Jan. 13, 2014

(65) Prior Publication Data

US 2014/0127895 A1  May 8, 2014

Related U.S. Application Data

(62) Division of application No. 13/194,721, filed on Jul. 29, 2011, now Pat. No. 8,659,118.

(51) Int. Cl.
*H01L 21/768* (2006.01)
*H01L 23/525* (2006.01)

(52) U.S. Cl.
CPC ...... *H01L 21/76886* (2013.01); *H01L 23/5256* (2013.01)

(58) Field of Classification Search
USPC .......................... 438/132, 281, 467

IPC .................................................. H01L 23/5256
See application file for complete search history.

(56) References Cited

U.S. PATENT DOCUMENTS

| | | | |
|---|---|---|---|
| 5,882,998 A | 3/1999 | Sur, Jr. et al. |
| 5,903,041 A | 5/1999 | La Fleur et al. |
| 6,033,939 A | 3/2000 | Agarwala et al. |
| 6,219,215 B1 | 4/2001 | Bertin et al. |
| 6,368,902 B1 | 4/2002 | Kothandaraman et al. |
| 6,444,503 B1 | 9/2002 | Yu |
| 6,661,330 B1 | 12/2003 | Young |
| 6,670,824 B2 | 12/2003 | Goodbread et al. |
| 6,828,652 B2 | 12/2004 | Kothandaraman |
| 7,064,409 B2 | 6/2006 | Badami et al. |
| 7,684,165 B2 | 3/2010 | Berberich et al. |
| 7,759,226 B1 | 7/2010 | Lee et al. |
| 7,982,285 B2 | 7/2011 | Park et al. |
| 8,013,420 B2 | 9/2011 | Shin et al. |
| 2002/0037643 A1 | 3/2002 | Ishimaru |
| 2003/0153173 A1 | 8/2003 | Chuang |
| 2003/0179011 A1 | 9/2003 | Goodbread et al. |

(Continued)

FOREIGN PATENT DOCUMENTS

| CN | 1359155 A | 7/2002 |
| FR | 2917535 A1 | 12/2008 |

(Continued)

*Primary Examiner* — Eugene Lee
(74) *Attorney, Agent, or Firm* — Slater & Matsil, L.L.P.

(57) ABSTRACT

A semiconductor device comprises a semiconductor substrate, an anorganic isolation layer on the semiconductor substrate and a metallization layer on the anorganic isolation layer. The metallization layer comprises a fuse structure. At least in an area of the fuse structure the metallization layer and the anorganic isolation layer have a common interface.

13 Claims, 14 Drawing Sheets

(56) References Cited

U.S. PATENT DOCUMENTS

| | | |
|---|---|---|
| 2003/0209734 A1 | 11/2003 | Kothandaraman |
| 2006/0181833 A1 | 8/2006 | Brown et al. |
| 2008/0217736 A1* | 9/2008 | Cestero et al. ................ 257/530 |
| 2009/0224323 A1* | 9/2009 | Im et al. ........................ 257/355 |

FOREIGN PATENT DOCUMENTS

| | | |
|---|---|---|
| JP | 59000956 A | 1/1984 |
| JP | 583935 A | 4/1993 |
| KR | 20070076282 A | 7/2007 |
| WO | 2010119436 A1 | 10/2010 |

* cited by examiner

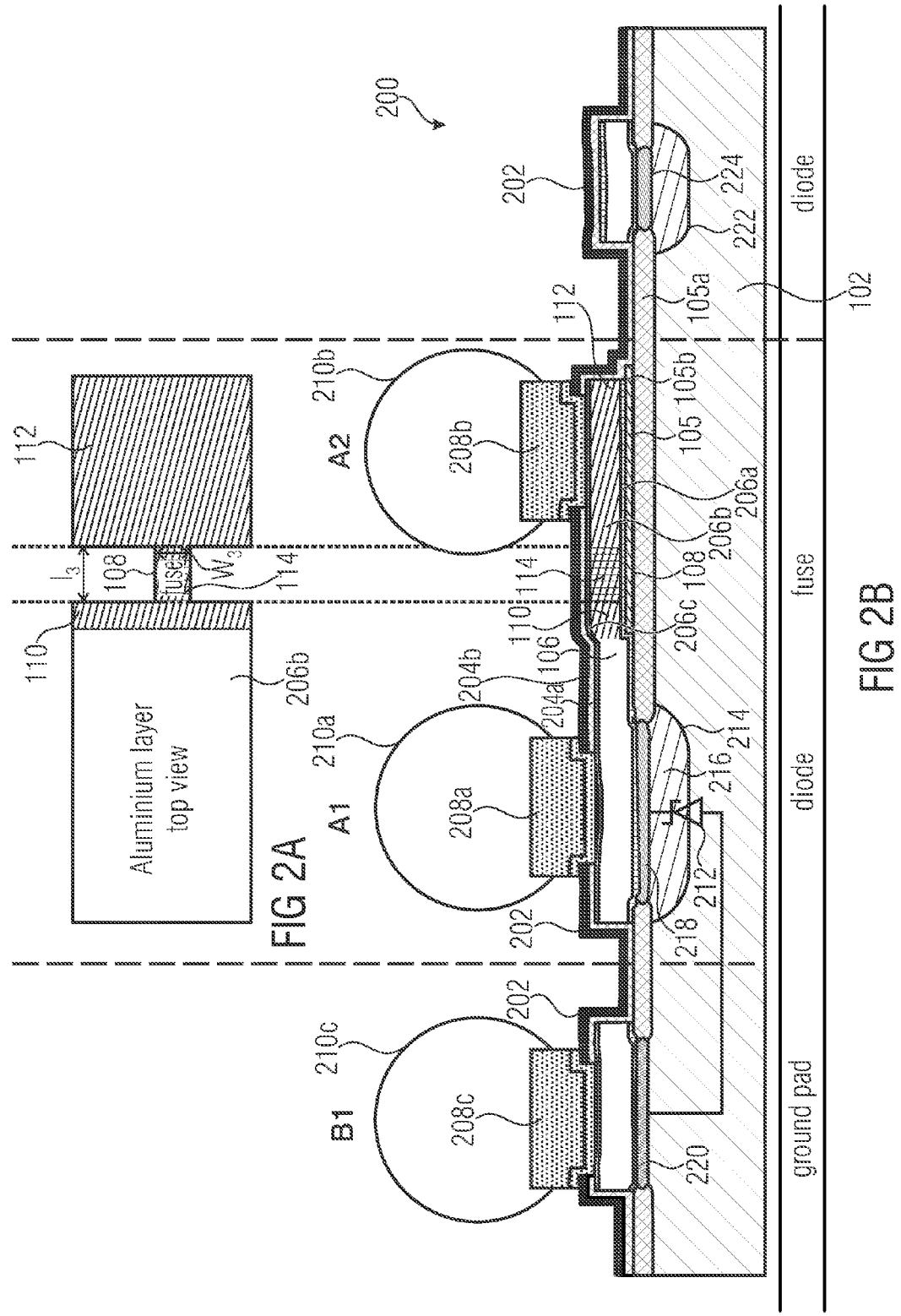

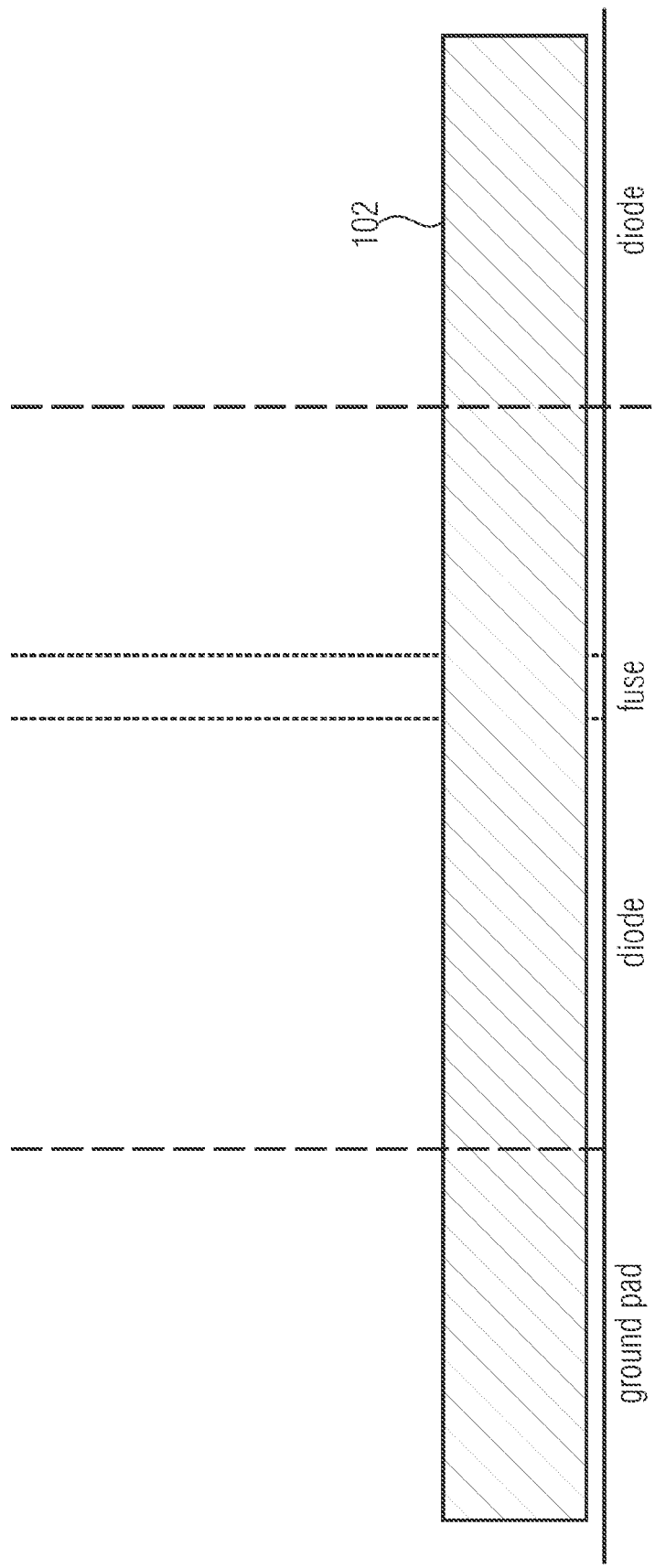

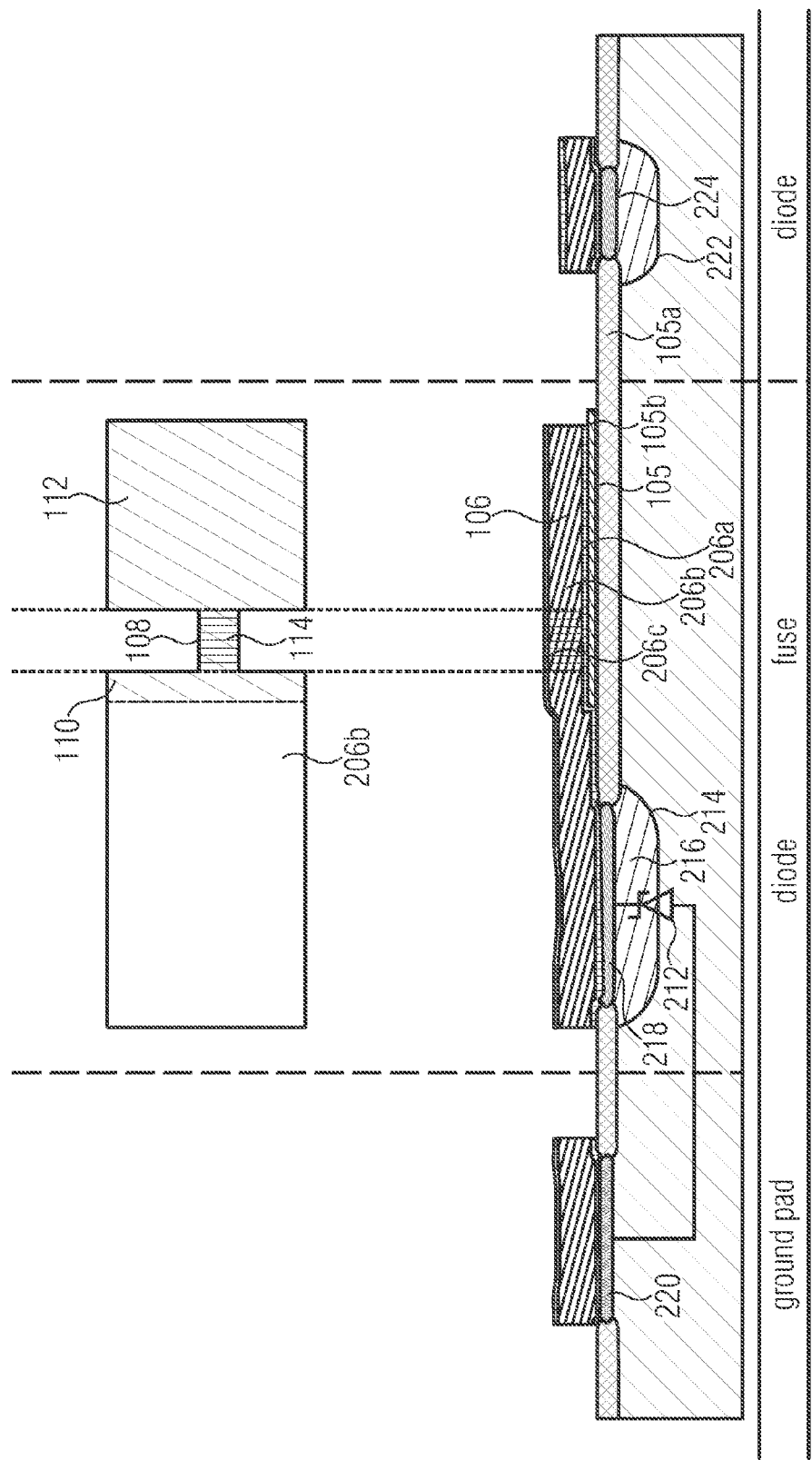

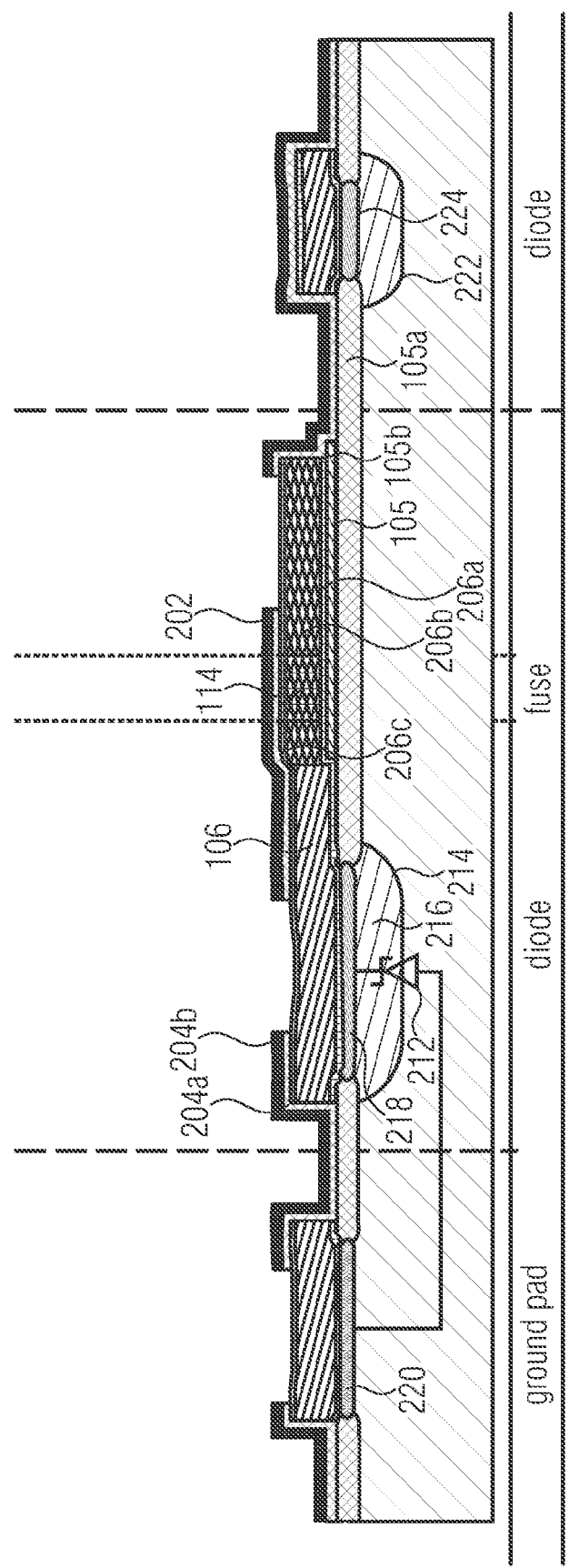

SEMICONDUCTOR DEVICE COMPRISING A FUSE STRUCTURE AND A METHOD FOR MANUFACTURING SUCH SEMICONDUCTOR DEVICE

This is a divisional application of U.S. application Ser. No. 13/194,721, entitled "Semiconductor Device Comprising a Fuse Structure and a Method for Manufacturing such Semiconductor Device" which was filed on Jul. 29, 2011 and is incorporated herein by reference.

TECHNICAL FIELD

Embodiments of the present invention relate to a semiconductor device comprising a fuse structure. Further embodiments of the present invention relate to a method for manufacturing such a semiconductor device.

BACKGROUND

In electronic devices, fuses are used to protect the circuits in these electronic devices from overcurrents, which may lead to an overheating of the electronic devices. Typically, SMD fuses (SMD—surface mounted device) are soldered on a board of such a device, for example, on a mobile phone PCB board (PCB—printed circuit board). A disadvantage of this concept is the limited packing level on such a PCB board and furthermore the high costs of such SMD fuses.

SUMMARY OF THE INVENTION

Embodiments of the present invention provide a semiconductor device comprising a semiconductor substrate, an anorganic isolation layer on the semiconductor substrate and a metallization layer on the anorganic isolation layer. The metallization layer comprises a fuse structure, wherein at least in an area of the fuse structure the metallization layer and the anorganic isolation layer have a common interface.

Further embodiments of the present invention provide a method for manufacturing such a semiconductor device. The method comprises a step of forming an anorganic isolation layer on a semiconductor substrate. The method further comprises a step of forming a metallization layer on the anorganic isolation layer. Furthermore, the method comprises a step of forming a fuse structure in the metallization layer, such that at least in an area of the fuse structure the metallization layer and the anorganic isolation layer have a common interface.

BRIEF DESCRIPTION OF THE DRAWINGS

Embodiments of the present invention will be described in more detail using the accompanying figures, in which:

FIG. 2a shows a top view of an aluminum layer of a metallization layer of a semiconductor device according to a further embodiment;

FIG. 2b shows a section view of the semiconductor device having the metallization layer of FIG. 2a;

FIGS. 4a-4h show section views of intermediate products how they may occur during producing a semiconductor device according to the method of FIG. 3.

DETAILED DESCRIPTION OF ILLUSTRATIVE EMBODIMENTS

Before embodiments of the present invention will be described in detail, it is to be pointed out that the same or functionally equal elements are provided with the same reference numbers and that a repeated description of elements provided with the same reference numbers is omitted. Hence, descriptions provided for elements with the same reference numbers are mutually exchangeable.

Figure 1A:
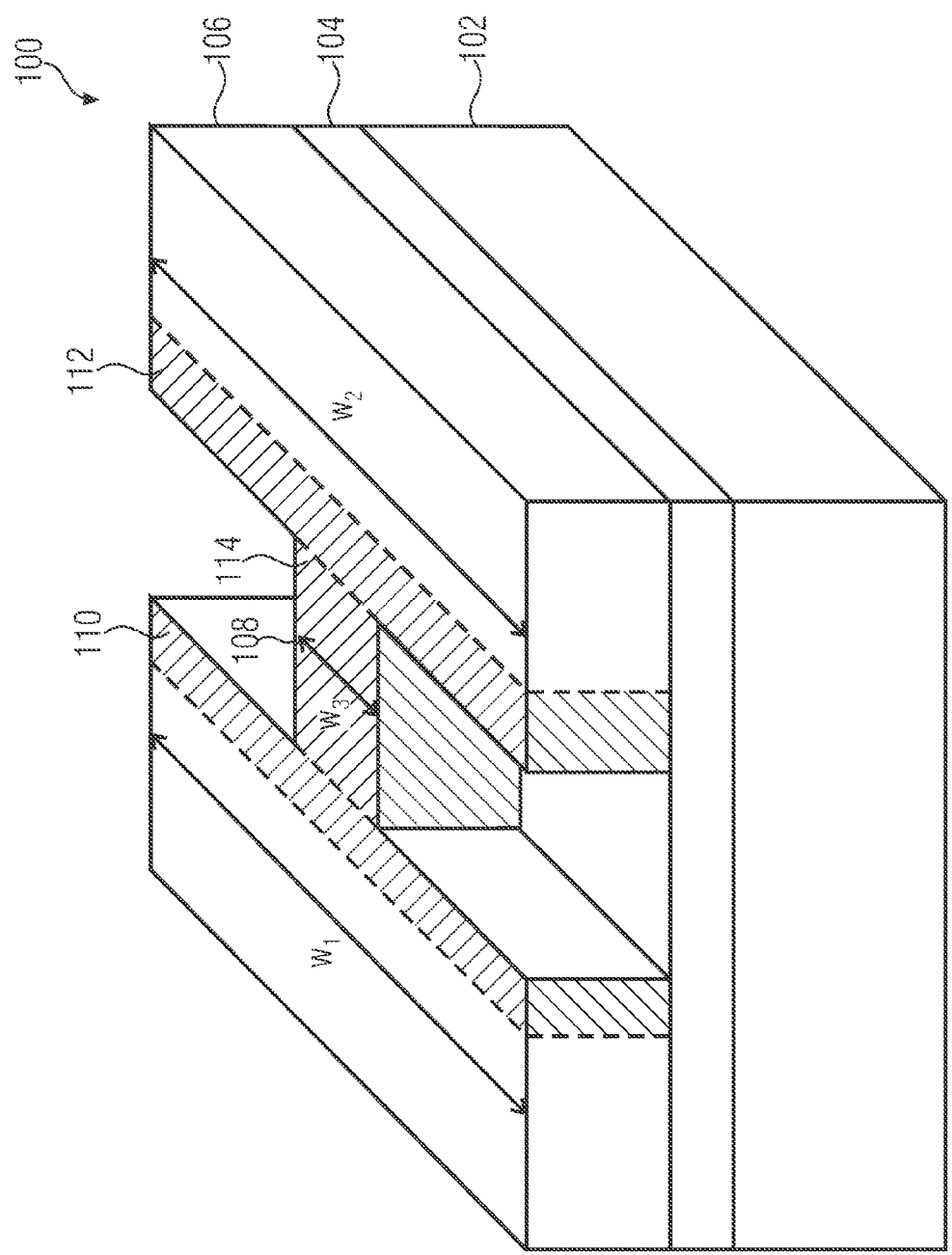
FIG. 1a shows a perspective view of a semiconductor device according to an embodiment of the present invention.

FIG. 1a shows a perspective view of a semiconductor device 100 according to an embodiment of the present invention. The semiconductor device 100 comprises a semiconductor substrate 102 and an anorganic isolation layer 104 on the semiconductor substrate 102.

In the following the semiconductor substrate 102 is also called substrate 102.

Furthermore, the semiconductor device 100 comprises a metallization layer 106 on the anorganic isolation layer 104. The metallization layer 106 comprises a fuse structure 108. In an area (shaded area of the FIG. 1a) of the fuse structure 108 the metallization layer 106 and the anorganic isolation layer 104 have a common interface. In other words, at least in the area of the fuse structure 108 the metallization layer 106 and the anorganic isolation layer 104 are adjacent to each other. In other words, in a layer staple direction of the semiconductor device 100 the metallization layer 106 directly follows, at least in the area of the fuse structure 108, the anorganic isolation layer 104.

By integrating the fuse structure 108 in the normal metallization layer 106 of the semiconductor device 100, a high level of miniaturization is achievable. Furthermore, the semiconductor device 100 has reduced PCB area requirements than an SMD fuse. Further advantages of the semiconductor device 100 are: the semiconductor device 100 has a very low operation resistance and the semiconductor device 100 can be produced using semiconductor processes/techniques. Hence, well-controlled fuse properties can be achieved with a specification guaranteed in ppm level. In short, the semiconductor device 100 provides a very cheap and precise integrated (no additional metallization layer needed) concept based on semiconductor process quality.

The fuse structure 108 can be easily integrated in any semiconductor technologies with other devices (for example, such as TVS diodes, resistors, transistors). In other words, the semiconductor device 100 may comprise further semiconductor elements, which are connected to each other using the metallization layer 106, in which also the fuse structure 108 is implemented. Therefore, the fuse structure 108 can be seen as a module that can be easily integrated with other elements in the semiconductor device 100.

As can be seen from FIG. 1a, the fuse structure 108 (in the following also called fuse) is integrated within the same metallization layer 106 as used for standard interconnects and pads of the semiconductor device 100. According to an embodiment, the field of application of the semiconductor 100 with the fuse structure 108 is the protection of circuits in case of overload. In other words, the fuse 108 could be considered as an overcurrent (EOS=electrical overstress) protection melting fuse, which is different to other commonly known fuses (like trimming or programmable fuses).

According to an embodiment of the present invention a metal (such as aluminum or copper) having electro- and thermal-migration effects can be used for the fuse structure 108 (and optionally also for the complete metallization layer 106) which allows a good adjustment of the fuse lifetime.

By having such a metal aggressive life time specifications for a narrow current range can be achieved, for example for a 2 A rated fuse, a fusing time at 5 A may be more than a factor of 107 shorter than a fuse lifetime at 2 A.

As can be seen from FIG. 1a, the fuse structure 108 may be formed by a first fuse region 110 of the metallization layer 106, a second fuse region 112 of the metallization layer 106 and a third fuse region 114 of the metallization layer 106. The third fuse region 114 may form a fuse element connecting the first fuse region 110 and the second fuse region 112. The fuse element 114 may have, at least partially, a minimum width w3 which is at least 30%, 50% or 70% smaller than a width w1 of the first fuse region 110 and a width w2 of the second fuse region 112 of the fuse structure 108. By having the smaller width w3 of the fuse element 114 than the widths w1, w2 of the fuse regions 110, 112 the resistance of the third fuse region 114 is higher than the resistance of the first fuse region 110 and the second fuse region 112, which leads to a faster heating of the fuse element 114 in case of an overcurrent and therefore, to a melting of the fuse element 114 before the first fuse region 110 and the second fuse region 112 start to melt. Furthermore, due to the small width w3 an electro migration of the fuse element 114 happens faster than an electromigration of the fuse regions 110, 112.

Furthermore, the use of the anorganic isolation layer 104, for example, instead of a polymer passivation layer has the advantage that the complete semiconductor device 100 can be produced during a normal semiconductor production process and the fuse structure 108 can be integrated in the normal metallization layer for connecting the different elements of the semiconductor device 100.

This would not be possible using polymer passivation layers, as these have to be produced in a different process (after producing the different elements of the semiconductor device). Furthermore, an integration of the fuse structure into the normal metallization layer of such a semiconductor device would not possible anymore, as during this state of production, the metallization layer is typically already sealed. Hence, the fuse structure can only be integrated on top of the sealed metallization layer on an additional fuse metallization layer. But this would increase the cost of such a fuse device.

To summarize, for realizing the fuse structure 108, the standard BEOL (back end of line) metallization is used, which furthermore, can be used for connecting other elements, for example, active or passive components or elements of the semiconductor device 100.

According to further embodiments, the anorganic isolation layer 104 may comprise at least one silicon-based non-conductive sublayer.

Figure 1B:
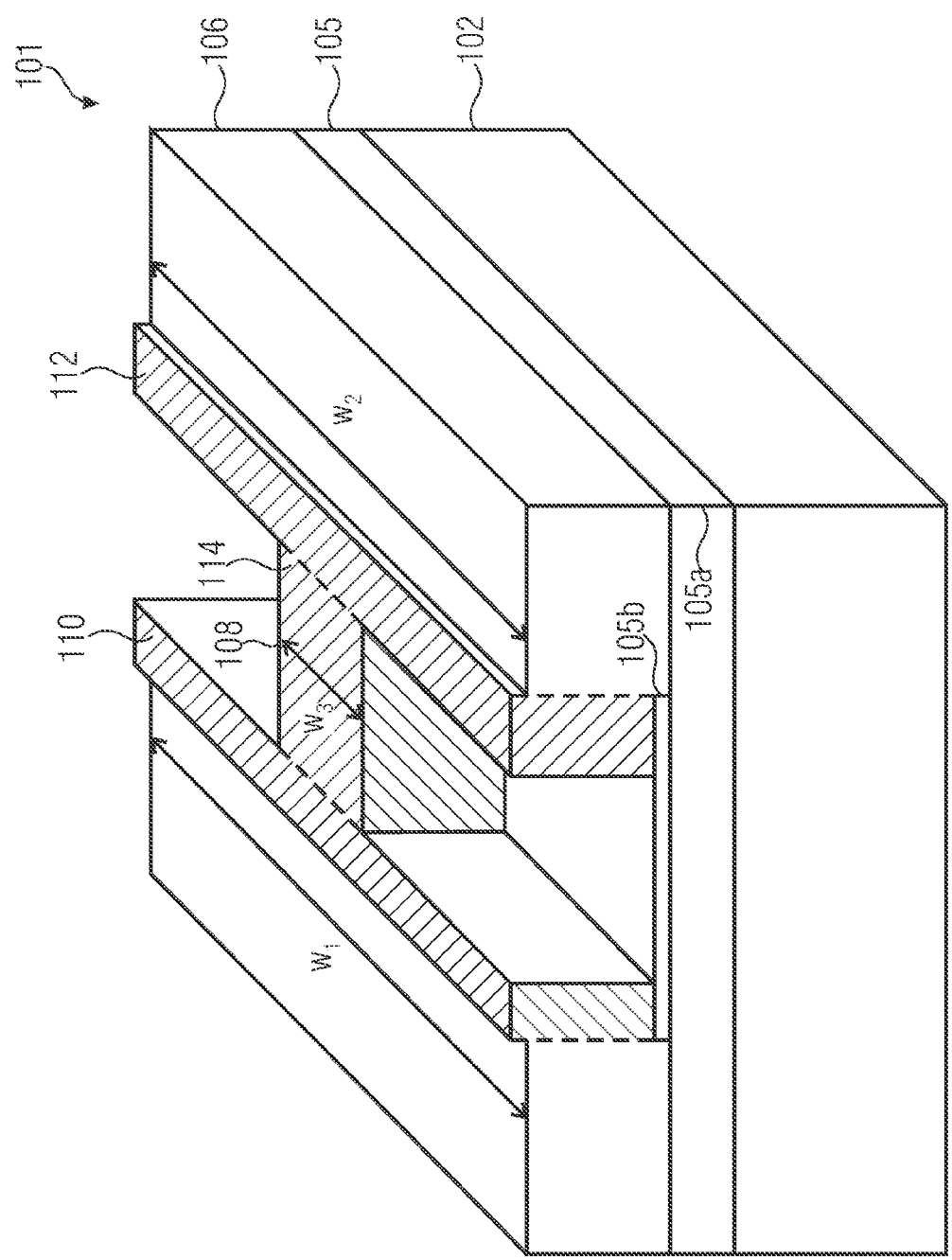
FIG. 1b shows a perspective view of a semiconductor device according to a further embodiment of the present invention.

FIG. 1b shows a device 101, which extends the device 100 in that an anorganic isolation layer 105 of the device 100 which is arranged between the substrate 102 and the metallization layer 106 comprises a first anorganic sublayer 105a on the substrate 102 and a second anorganic sublayer 105b which is arranged, at least in the area of the fuse structure 108, between the metallization layer 106 and the first anorganic sublayer 105a. In FIG. 1b it can be seen that the first anorganic sublayer 105a is arranged in the area of the fuse structure 108 (the shaded area) and in a non-fuse area being adjacent to the area of the fuse structure 108. Furthermore, it can be seen that the second anorganic sublayer 105b can be arranged only in the area of the fuse structure 108. This second anorganic sublayer 105b can be used to control the slope of the fuse destruction time (ms vs. years) vs. the applied current. Furthermore, the second anorganic sublayer 105b acts as a thermal barrier and allows a precise adjustment of the fuse characteristics (fusing time, lifetime).

As can be seen from FIG. 1b, the second anorganic sublayer 105b may have a common interface with the metallization layer 106 in the area of the fuse structure 108 and, therefore, may have a common interface with the first fuse area 110, the second fuse area 112 and the fuse element 114 of the fuse structure 108. Furthermore, the second anorganic sublayer 105b may have a common interface with the first anorganic sublayer 105a in the area of the fuse structure 108. In other words, in the area of the fuse structure 108, the second anorganic sublayer 105b may be arranged between the metallization layer 106 and the first anorganic sublayer 105a.

According to an embodiment of the present invention, the first anorganic sublayer 105a may be a thermal or non thermal (e.g. deposited) oxide layer having a thickness between (including) 100 nm and (including) 2,000 nm. Furthermore, the second anorganic sublayer 105b may be a deposition oxide layer having a thickness ≤10,000 nm.

According to a further embodiment of the present invention, the first anorganic sublayer 105a may be a FOX layer (FOX—field oxide). According to a further embodiment of the present invention, the second anorganic sublayer 105b may be a TEOS layer (TEOS—Tetraethyl Orthosilicate). Instead of the standard oxides FOX and TEOS other materials may be used also for the anorganic sublayers 105a, 105b, such as SiC, SixOyNz and/or SixNy.

Furthermore, as can be seen from FIG. 1b, due to the second anorganic sublayer 105b in the area of the fuse structure 108, material of the metallization layer 106 is protruding in the area of the fuse structure 108 over material of the metallization layer 106 outside the area of the fuse structure 108 (or outside an area of the second anorganic sublayer 105b and/or outside an area of the first anorganic sublayer 105a).

FIG. 2b shows a section view of a semiconductor device 200 according to a further embodiment of the present invention.

The semiconductor device 200 comprises the same layer as the device 101 shown in FIG. 1b and some additional layers and elements which will be described in the following. Hence, the semiconductor device 200 comprises the substrate 102 with the anorganic isolation layer 105 arranged on the substrate 102. The anorganic isolation layer 105 comprises the first anorganic sublayer 105a and the second anorganic sublayer 105b. The anorganic sublayer 105b is at least in the area of the fuse structure 108 arranged between the metallization layer 106 and the first anorganic sublayer 105a. Therefore, in the area of the fuse structure 108, the second anorganic sublayer 105b has a common interface with the metallization layer 106 and the first anorganic sublayer 105a. Furthermore, the first anorganic sublayer 105a has a common interface with the metallization layer 106 in the non-fuse area of the semiconductor device 200.

According to further embodiments the metallization layer 106 may have, in the non-fuse area of the semiconductor device 200, a common interface with the substrate 102. Or in other words, outside the fuse area the semiconductor device 200 may comprise one or more areas in which no isolation layer is provided between the substrate 102 and the metallization layer 106.

As can be seen from FIG. 2b, the semiconductor device 200 may comprise an anorganic passivation layer 202 arranged on the metallization layer 106. The anorganic passivation layer 202 may have, at least in the area of the fuse structure 108, a common interface with the metallization layer 106.

According to further embodiments, the anorganic sublayer 202 may be omitted in the area of the fuse structure 108 (e.g. in the area of the fuse element 114), such that the anorganic passivation layer 202 has an opening above the fuse element 114 from the outside (environment) of the semiconductor device 200 to the fuse element 114. The opening may have the same dimensions (in length l3 and in width w3) as the fuse element 114. According to further embodiments, the opening may be smaller than the fuse element 114.

According to other embodiments the anorganic passivation layer 202 may be fully omitted.

In the example shown in FIG. 2b the anorganic passivation layer 202 may comprise a passivation oxide sublayer 204a and a passivation nitride sublayer 204b. The passivation oxide sublayer 204a may be arranged between the passivation nitride sublayer 204b and the metallization layer 106. Furthermore, the metallization layer 106 may comprise a first conductive sublayer 206a comprising a liner (such as Ti and/or TiN or Ti—W). Furthermore, the metallization layer 106 may comprise a second conductive sublayer 206b, comprising aluminum. The first conductive sublayer 206a may be arranged between the anorganic isolation layer 105 and the second conductive sublayer 206b. A thickness of the second conductive sublayer 206b may be larger (e.g. at least five times larger) than a thickness of the first conductive sublayer 206a.

Hence, characteristics of the fuse structure 108 (and the fuse element 114) mainly depend on the second conductive sublayer 206b, which in the example show in FIG. 2b comprises Aluminum but may, in further embodiments, comprise another conductive material, such as copper.

Furthermore, the metallization layer 106 may comprise a third conductive sublayer 206c arranged on the second conductive sublayer 206b, such that the second conductive sublayer 206b is arranged between the first conductive sublayer 206a and the third conductive sublayer 206c. The third conductive sublayer 206c may comprise the same liner as the first conductive sublayer 206a. Furthermore, the third conductive sublayer 206c may be an anti-reflective layer (ARC-layer).

FIG. 2a shows a top view of the second conductive sublayer 206b (also designated as aluminum layer) to illustrate how the second conductive sublayer 206b is formed in the semiconductor device 200.

Furthermore, the semiconductor device 200 may comprise a first Under Bump Metallization 208a on the metallization layer 106 forming a first terminal A1 for providing a first electrical connection to the fuse structure 108. Furthermore, the semiconductor device 200 may comprise a second Under Bump Metallization 208b on the metallization layer 106 forming a second terminal A2 for providing a second electrical connection to the fuse structure 108. The first Under Bump Metallization 208a and the second Under Bump Metallization 208b are geometrically separated from each other. In other words, the first Under Bump Metallization 208a and the second Under Bump Metallization 208b are not conductively connected in a layer of the Under Bump Metallizations 208a, 208b.

Instead, the first Under Bump Metallization 208a is conductively connected to (or coupled with) the second Under Bump Metallization 208b only by means of the metallization layer 106. In other words, electrical current coming from the first terminal A1 and flowing to the second terminal A2 is routed along the fuse structure 108 and therefore along the fuse element 114, as no other electrical connection between the first Under Bump Metallization 208a and the second Under Bump Metallization 208b exist in the semiconductor device 200 (as long as the semiconductor device 200 does not have a malfunction).

If the fuse element 114 is destroyed, for example, because of melting or electromigration, no current can flow anymore from the first terminal A1 to the second terminal A2.

On the Under Bump Metallizations 208a, 208b the device 200 may comprise solder balls 210a, 210b.

A material of the Under Bump Metallization 208a, 208b may be different than a material of the second conductive sublayer 206b. As mentioned before, the second conductive sublayer 206b may comprise aluminum. The Under Bump Metallization 208a, 208b may comprise copper.

Instead of Under Bump Metallizations or additionally to the Under Bump Metallizations 208a, 208b, the semiconductor device 200 may comprise copper pillars on the metallization layer 106. In the case of a metallization layer 106 having the second conductive sublayer comprising aluminum, the copper pillars may have a common interface with the third conductive sublayer or the liner 206c.

When choosing copper as material for the second conductive sublayer 206b, the first conductive sublayer 206a and the third conductive sublayer 206c may be omitted. In this case, the copper pillars may have a common interface with the second conductive sublayer 206b and therefore with copper.

According to further embodiments the conductive sublayer 206c may be a barrier between the second conductive sublayer 206b and the Under Bump Metallizations 208a, 208b or copper pillars.

According to other embodiments, the semiconductor device 200 may comprise an additional layer as a barrier between the third conductive sublayer 206c and the Under Bump Metallizations 208a, 208b or copper pillars.

Such barriers may comprise TiW (titanium tungsten) and/or TiNi (titanium nitride).

In other words, according to further embodiments, the semiconductor device 200 may comprise a first copper pillar on the metallization layer 106 forming the first terminal A1 for providing a first electrical connection to the fuse structure 108. Furthermore, the semiconductor device 200 may comprise a second copper pillar on the metallization layer 106, forming the second terminal A2 for providing a second electrical connection to the fuse structure 108. The first copper pillar and the second copper pillar may be geometrically separated from each other and may be conductively coupled with each other only by means of the metallization layer 106.

Furthermore, the semiconductor device 200 may comprise a diode 212 formed in the semiconductor substrate 102. The diode 212 may be a TVS diode (TVS—Transient Voltage Suppressor). A first electrode region 214 of the diode 212 (for example, a cathode region of the diode 212) and the fuse structure 108 may share the common terminal A1 for electrically connecting the fuse structure 108 and the first electrode region 214 of the diode 212. The first electrode region 214 of the diode 212 may comprise a well, for example an n-well 216 and a highly doped region 218, for example, an n-plus region 218. The highly doped region 218 may have a common interface with the metallization layer 106.

Furthermore, the TVS diode 212 may comprise a second electrode region 220 (for example, an anode region), the second electrode region may be a highly doped region (for example, a p-plus region).

In the example shown in FIG. 2b the substrate 102 is a p-doped substrate, the well 216 is an n-well, the highly doped region 218 is an n-plus doped region and the highly doped region 220 is a p-plus doped region. Of course a complementary implementation would be possible also.

The metallization layer 106 may be arranged in an area of the second electrode region 220, such that the metallization layer 106 and the second electrode region 220 have a common interface. The material of the metallization layer 106 in the area of the second electrode region 220 may be electrically isolated from material of the metallization layer 106 in the area of the fuse 108, such that the diode 212 is established between the first electrode region 214, the substrate 102 and the second electrode region 220. For contacting the second electrode region 220, the semiconductor device 200 may comprise a third Under Bump Metallization 208c, having a common interface with the metallization layer 106 in the area of the second electrode region 220. The third Under Bump Metallization 208c may form a third terminal B1 of the semiconductor device 200 for providing an electrical connection to the second electrode region 220 of the diode 212. Furthermore, the semiconductor device 200 may comprise a third solder ball 210c on the third Under Bump Metallization 208c.

From FIG. 2b it can be seen that the first electrode region 214 of the diode 212 is arranged in the substrate 102 such that, in the non-fuse area being adjacent to the area of the fuse structure 108, the first electrode region 214 of the diode 212 and the metallization layer 106 have a common (conductive) interface.

According to further embodiments, the semiconductor device 200 may comprise a further well 222 (for example a further n-well) and a further highly doped region 224 (for example a further n-plus doped region). The metallization layer 106 and the further highly doped region 224 may have a common interface. Material of the metallization layer 106 in an area of the further highly doped region 224 may be isolated from the material of the metallization layer 106 in the area of the fuse structure 108.

In the following examples for materials and thicknesses in layer staple direction of the layers of the semiconductor device 200 are given.

The substrate 102 may be a doped semiconductor substrate comprising silicon, for example, the substrate 102 may be a p-substrate. The substrate 102 may have a thickness in a region from 10,000 nm to 5 million nm. The first electrode region 214 may have a thickness in a region from 100 nm to 10,000 nm).

The first conductive sublayer 206a which may comprise Ti and/or TIN may comprise a thickness in a region from 5 nm to 50 nm for Ti and in a region from 15 nm to 300 nm for TIN.

The second conductive sublayer 206b (which may comprise ALSICU or may consist of ALSICU) may have a thickness in a region from 500 nm to 5,000 nm.

The third conductive sublayer 206c may have a thickness in a region from 5 nm to 100 nm).

The Under Bump Metallizations 208a and 208b (which may comprise copper) may have a thickness in a region from 1,000 nm to 50,000 nm.

The first anorganic sublayer 105a (which may be a FOX layer) may have a thickness in a region from 100 nm to 2,000 nm.

The second anorganic sublayer 105b (which may be a TEOS layer) may have a thickness smaller than 10,000 nm).

The passivation oxide sublayer 204a may have a thickness in a region from 15 nm to 1,000 nm.

The passivation nitride sublayer 204b may have a thickness in a region from 100 nm to 1,000 nm.

The fuse element 114 may have a width w3 in a region from 5 μm to 100 μm. Furthermore, the fuse element 114 may have a length l3 in a region from 5 μm to 100 μm.

To summarize the semiconductor device 200 provides a combination of a fuse (for example, forming an overcurrent protecting melting fuse) with a TVS diode 212 in one semiconductor device 200. The fuse element 114 is integrated by means of a metallization interconnect (for example, an aluminum or copper interconnect) integrated in the semiconductor device 200. Therefore, embodiments enable the replacement of an SMD fuse by means of the aluminum (or copper) interconnect (acting as the fuse element 114) integrated in the semiconductor device 200 and, furthermore, provide a transient voltage suppressor diode 212.

In a typical implementation the semiconductor device 200 may not be implemented as shown in the section view 200. Instead, when looking from the same perspective as shown in FIG. 2b, the terminal B1 (together with the solder ball 210c), the Under Bump Metallization 208c and the second electrode region 220 would be placed behind the terminal A1. The further well 222 (and the further highly doped region 224) would be placed behind the terminal A2.

Figure 2C:
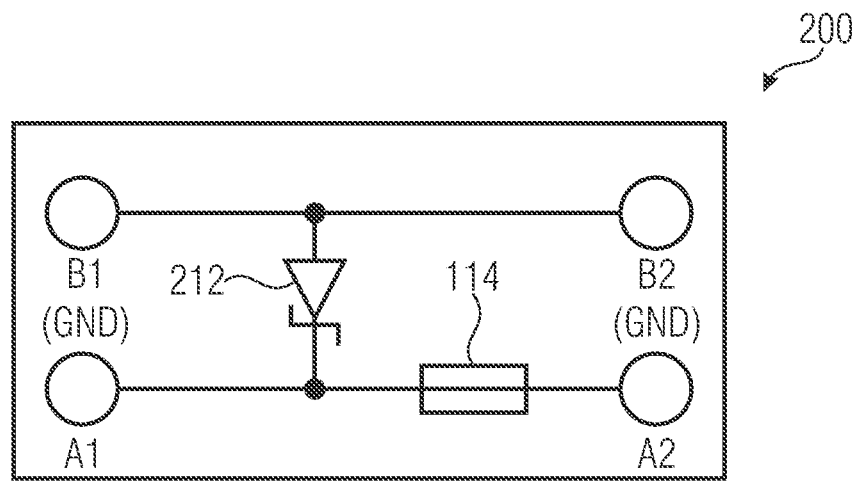
FIG. 2c shows an equivalent circuit diagram of the semiconductor device of FIG. 2b.

FIG. 2c shows a schematic top view on how the terminals of the semiconductor device 200 may be arranged.

The device 200 may comprise a fourth terminal B2 which can form, as the third terminal B1 a ground pad of the semiconductor device 200.

Figure 2D:
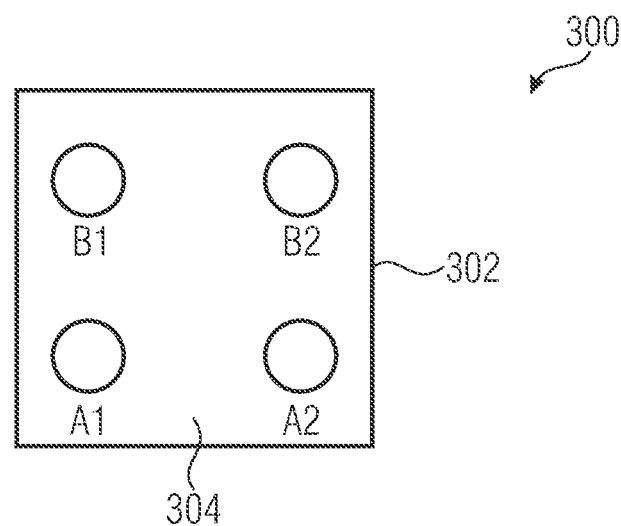
FIG. 2d shows a bottom view of a housed semiconductor device comprising the semiconductor device of FIG. 2b.

FIG. 2d shows a bottom view of a housed semiconductor device 300 according to a further embodiment of the present invention. The housed semiconductor device 300 comprises a semiconductor device 304 housed in the wafer level package 302. The semiconductor device 304 can be, for example, one of the semiconductor devices 100, 101, 200 or another semiconductor device according to an embodiment of the present invention.

In the following a method according to an embodiment of the present invention for producing the semiconductor device 200 will be described in detail using the FIGS. 3 and 4a to 4i.

Figure 3:
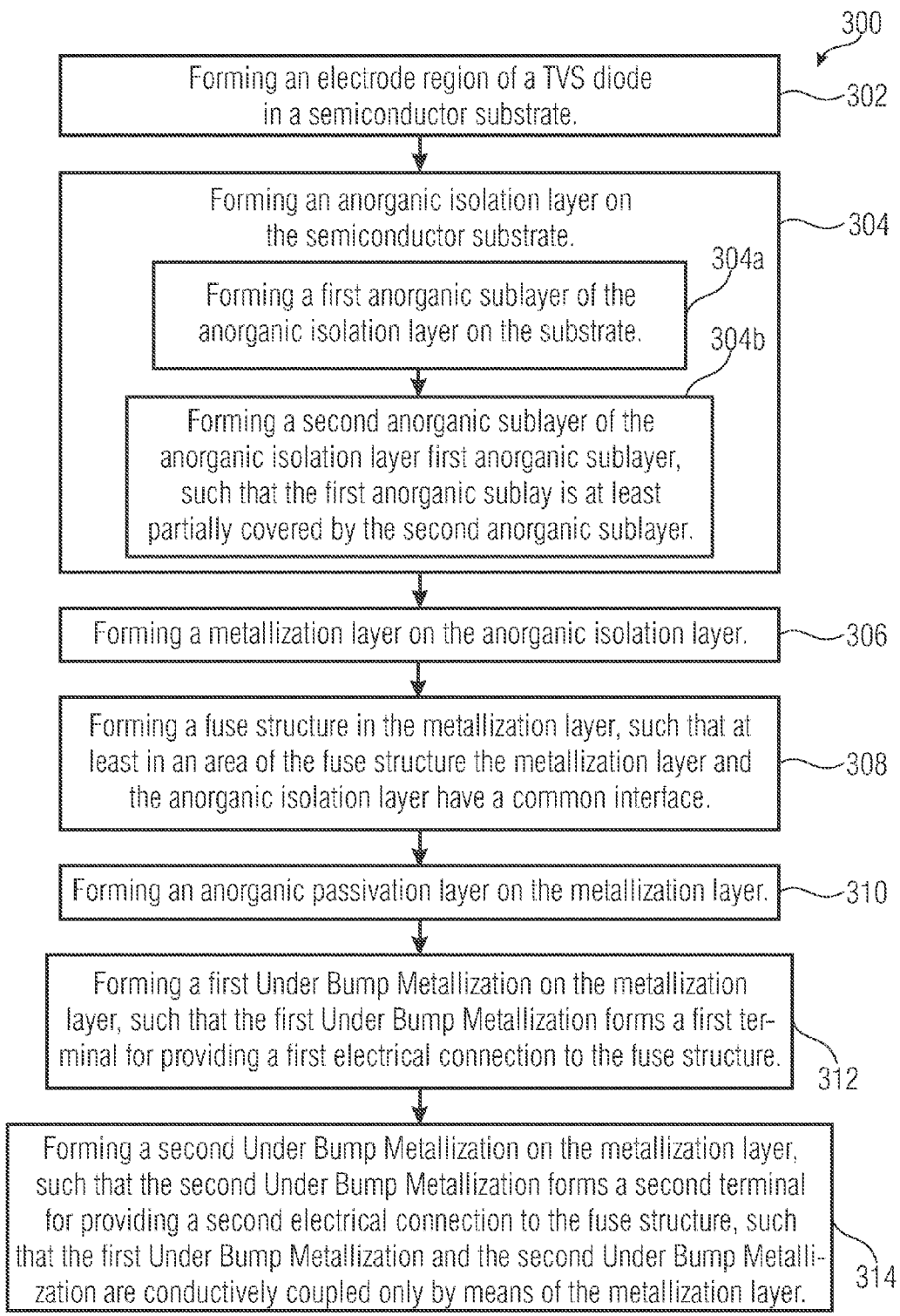
FIG. 3 shows a flow diagram of a method for producing a semiconductor device according to an embodiment of the present invention.
Figure 4B:
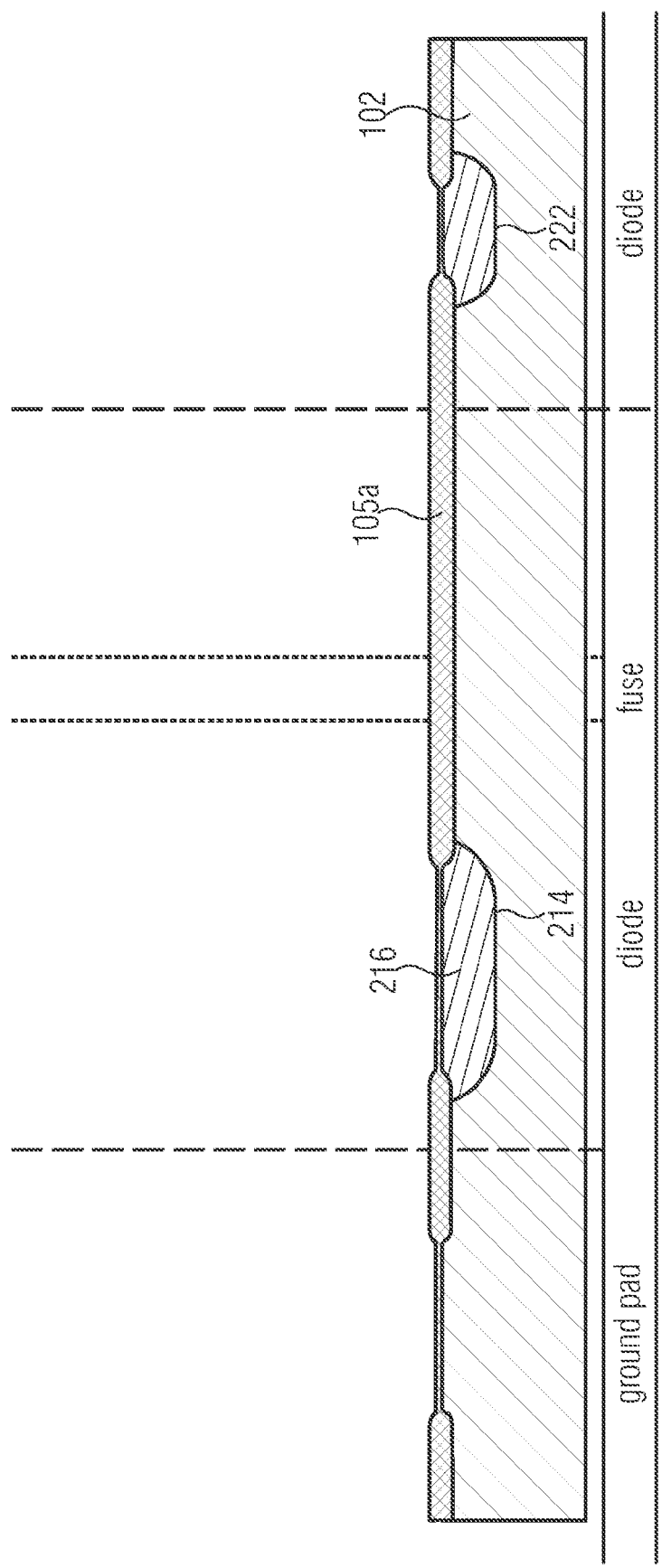
Figure 4C:
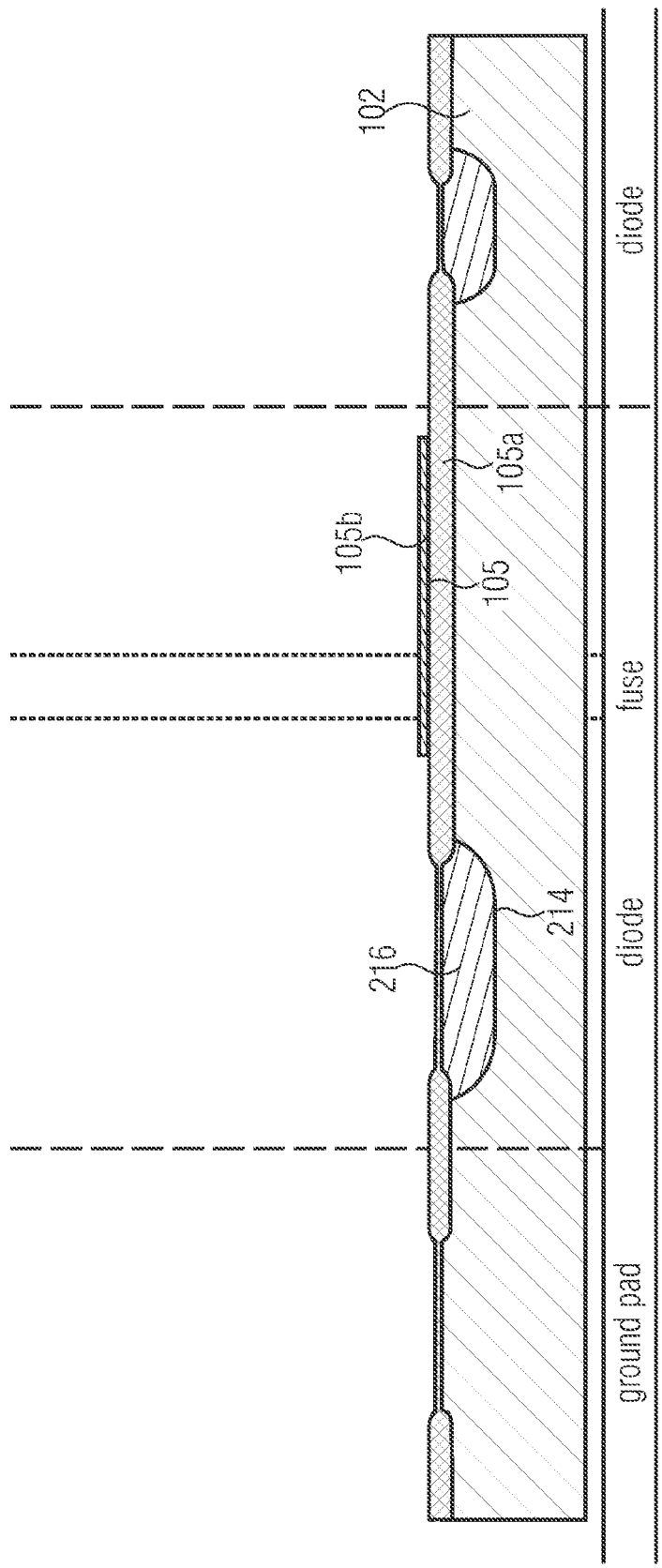
Figure 4D:
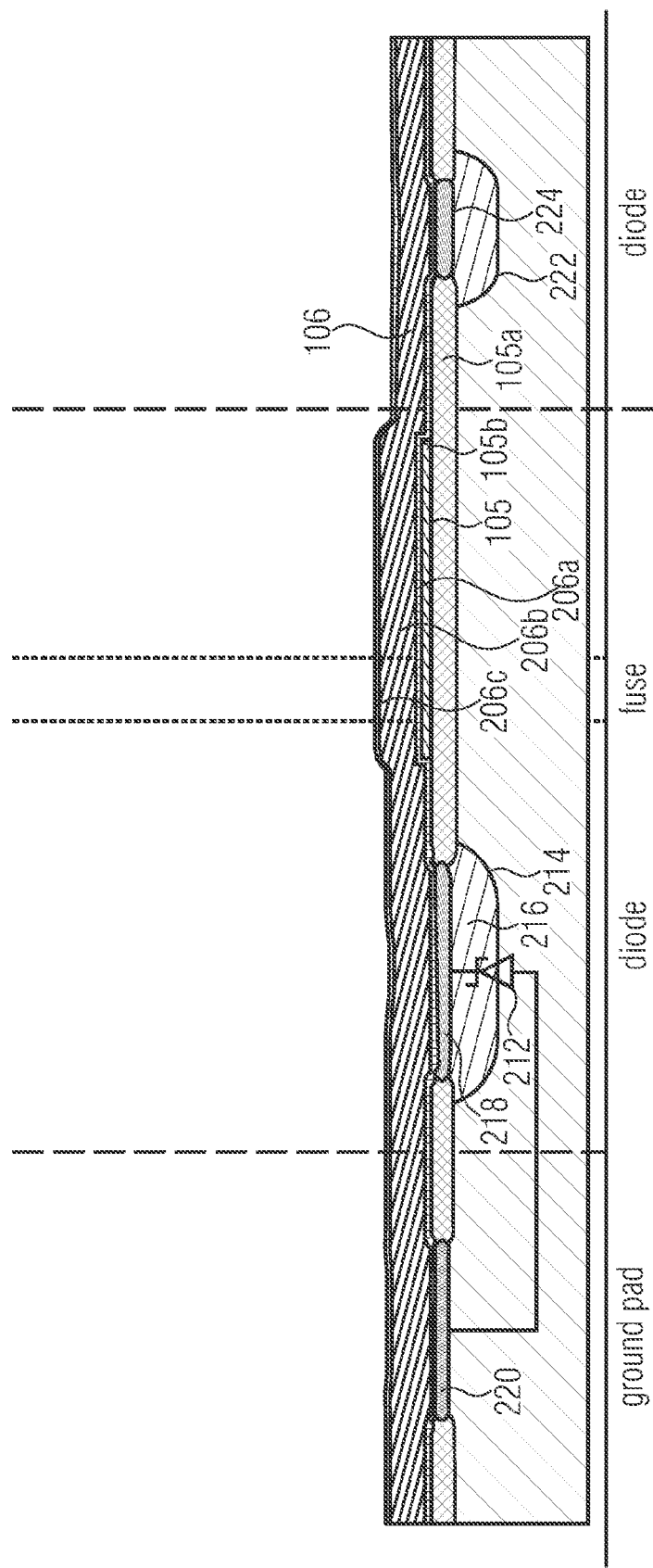
Figure 4E:
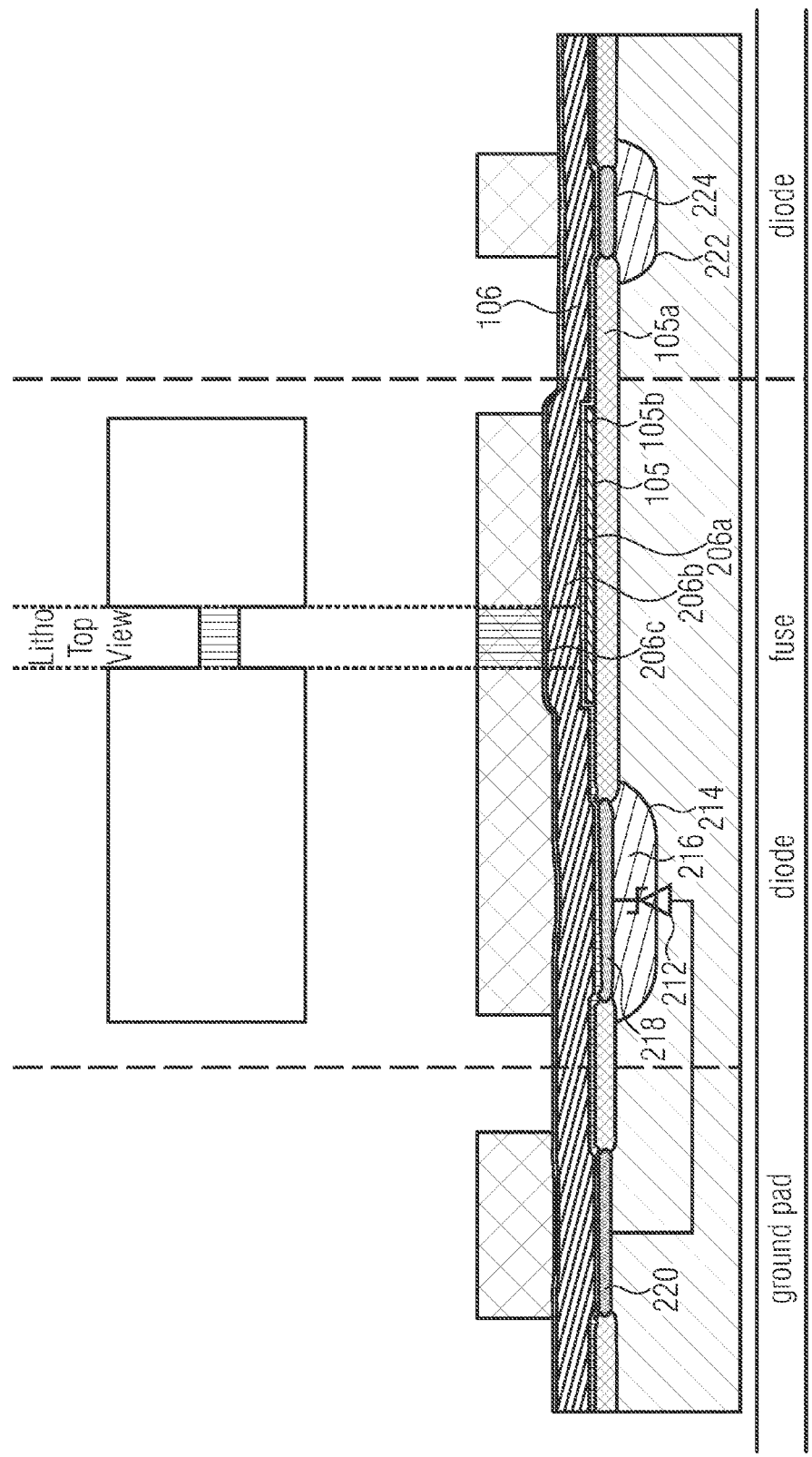

FIG. 3 shows a flow diagram of such a method 300. FIGS. 4a to 4h show different intermediate products during the production of the semiconductor device 200. FIG. 4i shows the end product.

FIG. 4a shows the semiconductor substrate 102.

In a first step 302 of the method 300 the first electrode region 214 of the TVS diode 212 is formed in the semiconductor substrate 102. In the described example the well 216 is formed in the substrate 102 first, while the highly doped region 218 is formed later. In other words, the step 302 may comprise a first substep of forming the well 216 of the first electrode region of the TVS diode 212 and a second substep of forming the highly doped region 218 of the first electrode region 214 of the TVS diode 212, which may be performed later in the method 300.

In other words, starting from the doped semiconductor material 102, the diode cathode region 214 is created and might be used to realize the diode structure or a diffusion resistance.

In a further step 304 of the method 300 the anorganic isolation layer 105 is formed on the semiconductor substrate 102. This can be done by a first substep 304a of forming the first anorganic sublayer 105a of the anorganic isolation layer 105 on the substrate 102. FIG. 4b shows an intermediate product after the first substep 304a. In another words, it follows a thermally grown oxide layer (dielectric 1—the first anorganic sublayer 105a).

Optionally, the slope of fuse destruction time (ms . . . years) vs. supply current might be controlled by a second oxide (the second anorganic sublayer 105b), in combination with the oxide layer 105a, which is deposited. It also acts as a thermal barrier and allows a precise adjustment of fuse characteristics (fusing time, lifetime). The second anorganic sublayer 105b can be formed in a second substep 304b of the step 304 of forming the second anorganic sublayer 105b on the first anorganic sublayer 105a, such that the first anorganic sublayer 105a is at least partially covered by the second anorganic sublayer 105b. FIG. 4c shows an intermediate product after the second substep 304a.

Using standard lithography processes an oxide opening (in the dielectric 1 or the first anorganic sublayer 105a is provided enabling device contact (for example, for the diode implementation). A similar oxide opening process can be done for the second oxide (for the second anorganic sublayer 105b).

In a further step 306 of the method 300 the metallization layer 106 is formed on the anorganic isolation layer 105. This can be done by aluminum deposition using standard lithography techniques. Furthermore, between the step 304 and step 306 the highly doped region 218 of the electrode region 214 of the TVS diode 212 and/or a ground contact (e.g. the second electrode region 220) can be formed in the second substep of step 302, for example, by implanting. Furthermore, also the second electrode region 220 of the TVS diode can be formed, for example, by implanting. FIG. 4d shows an intermediate product after the step 306.

Hence, in this example shown in FIGS. 4a-4i, the step 302 of forming the first electrode region 214 of the TVS diode 212 is finished before the step 306.

Furthermore, after forming the metallization layer 106 on the anorganic isolation layer 105, the fuse structure 108 can be formed in the metallization layer 106 in a step 308 of the method 300. The fuse structure 108 is formed such that at least in the area of the fuse structure 108 the metallization layer 106 and the anorganic isolation layer 105 have a common interface. Furthermore, in the example of the semiconductor device 200 comprising the second anorganic sublayer 105b the fuse structure is formed, such that the metallization layer 106 and the second anorganic sublayer 105b have a common interface in the area of the fuse structure 108 and such that the metallization layer 106 and the first anorganic sublayer 105a have a common interface in the non-fuse area adjacent to the area of the fuse structure 108.

Furthermore, the fuse structure 108 is formed in an area being adjacent to an area in which the first electrode region 214 of the TVS diode 212 is formed.

As already mentioned, the fuse structure 108 can be formed using standard lithography techniques. FIG. 4e shows in a top drawing a top view on a lithography mask for forming the fuse structure 108.

The fuse geometry of the fuse structure 108 and interconnections in the semiconductor device 200 are patterned simultaneously.

FIG. 4f shows an intermediate product after the step 308 with the already formed fuse structure 108.

It follows a deposition of a third dielectric (the anorganic passivation layer 202) which acts as passivation layer to protect the semiconductor device 200 from corrosion. This may be done in a step 310 of forming the anorganic passivation layer 202 (comprising the passivation oxide layer 204a and the passivation nitride layer 204b) on the metallization layer 106.

Figure 4G:
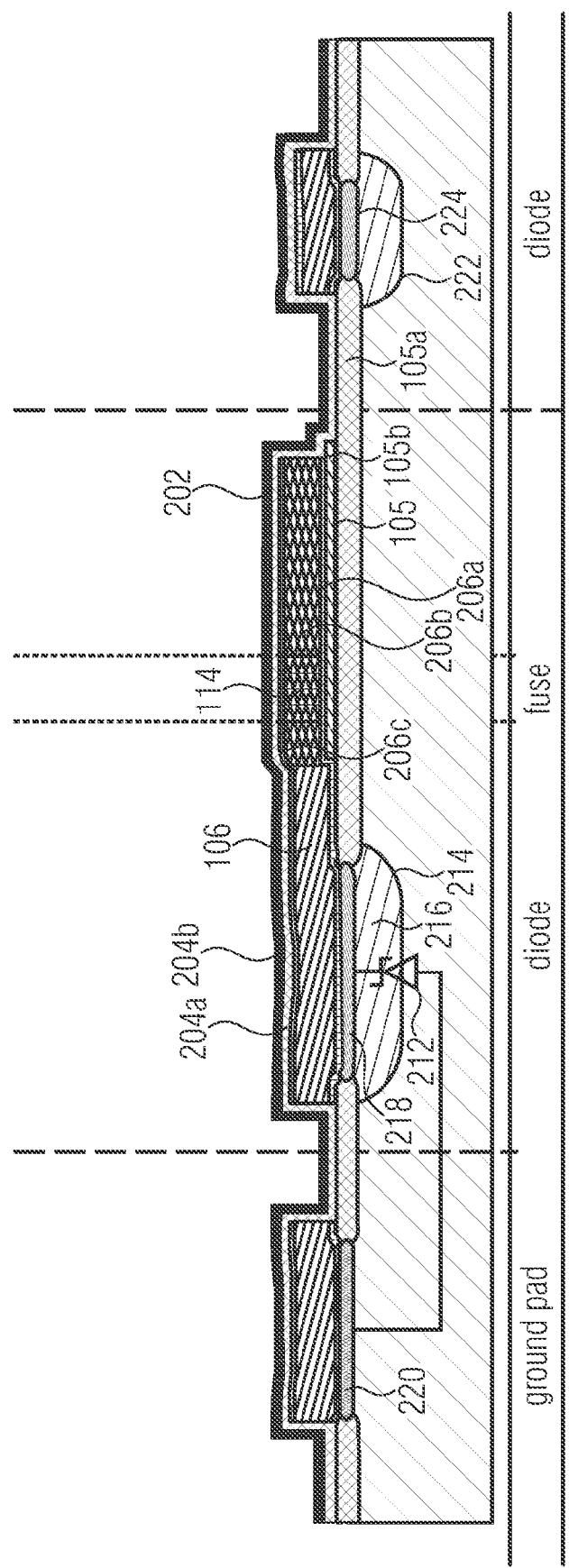
Figure 4I:
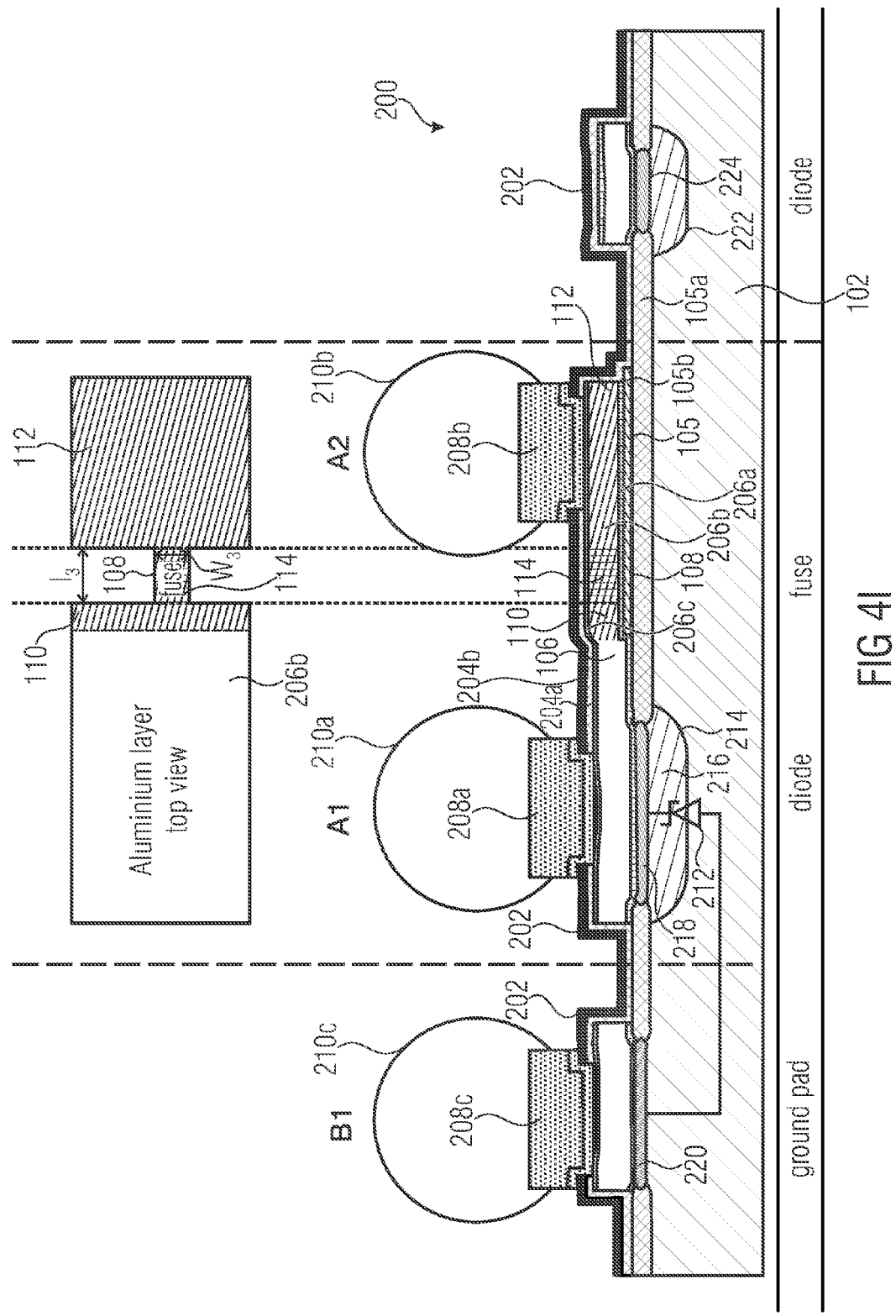
FIG. 4i shows a section view of an end product produced with the method of FIG. 3.

FIG. 4g shows an intermediate product after step 310 (after depositing the anorganic passivation layer 202).

Another oxide opening is provided for electrical contact (pad opening) to the external environment.

Optionally, a further oxide opening may be provided (not shown in the Figures) in the area of the fuse structure 118 (e.g. above the fuse element 114). Dimensions of the further opening may be equal to dimensions of the fuse element 114 or may be smaller, e.g., such that the fuse element 114 is not at all covered by the anorganic passivation layer 202 or is only partially covered by the anorganic passivation layer 202.

FIG. 4h shows an intermediate product after providing the oxide openings in the anorganic passivation layer 202.

The pads might be covered by Under Bump Metallization 208a, 208c, where solder balls 210a to 210c are placed to provide the electrical path.

For this, in a step 312 of the method 300 the first Under Bump Metallization 208a can be formed on the Metallization layer 106, which such that the first Under Bump Metallization 208a forms the first terminal A1 for providing the first electrical connection to the fuse structure 108.

Furthermore, in a step 314 (which may happen simultaneously to the step 312) of the method 300 the second Under Bump Metallization 208b is formed on the metallization layer 106, such that the second Under Bump Metallization 208b forms the second terminal A2 for providing the second electrical connection to the fuse structure 108. The first Under Bump Metallization 208a and the second Under Bump Metallization 208b can be formed geometrically separated, for example, such that the first Under Bump Metallization 208a and the second Under Bump Metallization 208b are conductively coupled only by means of the metallization layer 106.

As mentioned before, the Under Bump Metallizations 208a, 208b may be covered with solder balls 210a, 210b. Furthermore, the third Under Bump Metallization 208c can be formed in an area of the second electrode region 220 of the TVS diode 212 for forming a third terminal B1 for providing a second electrical connection to the TVS diode 212 (as the first electrical connection to the TVS diode 212 is already provided by the first terminal A1).

FIG. 4i shows a section view of the finished semiconductor device 200 (which is, of course, equal to the section view of the semiconductor device 200 shown in FIG. 2b) after finishing the method 300.

Although, a very detailed example has been given above, in the smallest embodiment of the present invention, the method 300 may comprise only the steps 304, 306 and 308 (for example for producing the semiconductor device 100 according to FIG. 1a).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

What is claimed is:

1. A method for manufacturing a semiconductor device, the method comprising:
  forming an anorganic isolation layer on a semiconductor substrate;
  forming a metallization layer on the anorganic isolation layer; and
  forming a fuse structure in the metallization layer such that at least in an area of the fuse structure the metallization layer and the anorganic isolation layer have a common interface, wherein forming the anorganic isolation layer comprises forming a first anorganic sublayer on the substrate in the area of the fuse structure and in a non-fuse area adjacent to the area of the fuse structure, and forming a second anorganic sublayer between the metallization layer and the first anorganic sublayer in the area of the fuse structure, wherein the second anorganic sublayer has a common interface with the first anorganic sublayer in the area of the fuse structure.

2. The method according to claim 1,
wherein forming the anorganic isolation layer comprises forming the first anorganic sublayer of the anorganic isolation layer on the substrate, and forming the second anorganic sublayer of the anorganic isolation layer on the first anorganic sublayer such that the first anorganic sublayer is at least partially covered by the second anorganic sublayer, and
wherein the fuse structure is formed on the second anorganic sublayer such that the metallization layer and the second anorganic sublayer have a common interface in the area of the fuse structure and the metallization layer and the first anorganic sublayer have a common interface in a non-fuse area adjacent to the area of the fuse structure.

3. The method according to claim 2, wherein the first anorganic sublayer is a thermal oxide layer having a thickness between 100 nm and 2000 nm and wherein the second anorganic sublayer is a deposition oxide layer having a thickness equal to or smaller than 5000 nm.

4. The method according to claim 2, wherein the first anorganic sublayer comprises a field oxide and wherein the second anorganic sublayer comprises a TEOS.

5. The method according to claim 1, wherein forming the metallization layer comprises forming a first conductive sublayer comprising a liner and forming a second conductive sublayer comprising aluminum, the first conductive sublayer being arranged between the anorganic isolation layer and the second conductive sublayer.

6. The method according to claim 5, wherein forming the metallization layer further comprises forming a third conductive sublayer arranged on the second conductive sublayer such that the second conductive sublayer is arranged between the first conductive sublayer and the third conductive sublayer.

7. The method according to claim 1, wherein the fuse structure comprises a first fuse region, a second fuse region and a fuse element, wherein a width of the fuse element is at least 30% smaller than a first width of the first fuse region and a second width of the second fuse region.

8. The method according to claim 1, further comprising forming an electrode region of a transient voltage suppressor (TVS) diode in the substrate, wherein the fuse structure is formed in an area adjacent to a non-fuse area in which the electrode region of the TVS diode is formed.

9. A method for manufacturing a semiconductor device, the method comprising:
forming an electrode region of a diode in a semiconductor substrate;
forming an anorganic isolation layer on the semiconductor substrate;
forming a metallization layer on the anorganic isolation layer;
forming a fuse structure in the metallization layer such that at least in an area of the fuse structure the metallization layer and the anorganic isolation layer have a common interface; and
forming anorganic passivation layer on the metallization layer, wherein forming the anorganic isolation layer comprises forming a first anorganic sublayer on the substrate in the area of the fuse structure and in a non-fuse area adjacent to the area of the fuse structure, and forming a second anorganic sublayer between the metallization layer and the first anorganic sublayer in the area of the fuse structure, wherein the second anorganic sublayer has a common interface with the first anorganic sublayer in the area of the fuse structure.

10. The method according to claim 9, further comprising forming a first Under Bump Metallization on the metallization layer such that the first Under Bump Metallization forms a first terminal thereby providing a first electrical connection to the fuse structure.

11. The method according to claim 10, further comprising forming a second Under Bump Metallization on the metallization layer such that the second Under Bump Metallization forms a second terminal thereby providing a second electrical connection to the fuse structure.

12. The method according to claim 9,
wherein forming the anorganic isolation layer comprises forming the first anorganic sublayer of the anorganic isolation layer on the substrate, and forming the second anorganic sublayer of the anorganic isolation layer on the first anorganic sublayer such that the first anorganic sublayer is at least partially covered by the second anorganic sublayer, and
wherein the fuse structure is formed on the second anorganic sublayer such that the metallization layer and the second anorganic sublayer have a common interface in the area of the fuse structure and the metallization layer and the first anorganic sublayer have a common interface in a non-fuse area adjacent to the area of the fuse structure.

13. The method according to claim 9, wherein forming the metallization layer comprises forming an aluminum layer.

\* \* \* \* \*